United States Patent
Otani et al.

(10) Patent No.: US 10,773,961 B2
(45) Date of Patent: Sep. 15, 2020

(54) SILVER-COATED GRAPHITE PARTICLES, SILVER-COATED GRAPHITE MIXED POWDER AND PRODUCTION METHOD THEREFOR, AND CONDUCTIVE PASTE

(71) Applicant: DOWA Electronics Materials Co., Ltd., Chiyoda-ku, Tokyo (JP)

(72) Inventors: Kairi Otani, Tokyo (JP); Noriaki Nogami, Tokyo (JP); Yoshio Moteki, Tokyo (JP); Taku Okano, Tokyo (JP)

(73) Assignee: DOWA ELECTRONICS MATERIALS CO., LTD., Tokyo (JP)

( * ) Notice: Subject to any disclaimer, the term of this patent is extended or adjusted under 35 U.S.C. 154(b) by 225 days.

(21) Appl. No.: 16/060,154

(22) PCT Filed: Dec. 6, 2016

(86) PCT No.: PCT/JP2016/086228
§ 371 (c)(1),
(2) Date: Jun. 7, 2018

(87) PCT Pub. No.: WO2017/099076
PCT Pub. Date: Jun. 15, 2017

(65) Prior Publication Data
US 2018/0362348 A1    Dec. 20, 2018

(30) Foreign Application Priority Data
Dec. 9, 2015 (JP) .................................. 2015-240596

(51) Int. Cl.
*C23C 18/42* (2006.01)
*C01B 32/21* (2017.01)
(Continued)

(52) U.S. Cl.
CPC ............ *C01B 32/21* (2017.08); *C08L 101/00* (2013.01); *C22C 5/06* (2013.01); *C23C 18/42* (2013.01);
(Continued)

(58) Field of Classification Search
None
See application file for complete search history.

(56) References Cited

U.S. PATENT DOCUMENTS 3,510,710 A * 5/1970 McCafferty ............ H01R 39/36
310/249
4,240,830 A * 12/1980 Lee ......................... C04B 35/52
419/28
(Continued)

FOREIGN PATENT DOCUMENTS

JP        63-012669        1/1988
JP        2007-306724      11/2007
(Continued)

OTHER PUBLICATIONS

Japanese Patent Office, Japanese First Office Action issued in corresponding Japanese application No. 2015-240596, dated Jul. 25, 2017.

*Primary Examiner* — George Wyszomierski
(74) *Attorney, Agent, or Firm* — Carmody Torrance Sandak & Hennessey LLP

(57) ABSTRACT

To provide a silver-coated graphite mixed powder including: silver-coated graphite particles each including a graphite particle and silver coated on a surface of the graphite particle, where when a solution obtained by dissolving the silver-coated graphite mixed powder in nitric acid is analyzed through inductively coupled plasma (ICP) emission spectrometry, an amount of silver is 5% by mass or more but 90% by mass or less, an amount of tin is 0.01% by mass or
(Continued)

more but 5% by mass or less, and an amount of zinc is 0.002% by mass or more but 1% by mass or less.

7 Claims, 8 Drawing Sheets

(51) Int. Cl.
  *C22C 5/06*     (2006.01)
  *H01B 1/22*     (2006.01)
  *C08L 101/00*    (2006.01)
  *H05K 1/09*     (2006.01)

(52) U.S. Cl.
  CPC ............... *H01B 1/22* (2013.01); *H05K 1/092* (2013.01); *C01P 2002/80* (2013.01); *C01P 2004/03* (2013.01); *C01P 2004/61* (2013.01)

(56) References Cited

U.S. PATENT DOCUMENTS

| | | | |
|---|---|---|---|
| 2002/0160193 A1* | 10/2002 | Hajmrle | C08K 9/02 428/403 |
| 2004/0053050 A1* | 3/2004 | Guerfi | G01N 27/4075 428/403 |
| 2009/0035562 A1* | 2/2009 | Fukushima | C22C 1/10 428/337 |
| 2009/0280326 A1* | 11/2009 | Giesenberg | B22F 1/0085 428/403 |
| 2011/0040007 A1* | 2/2011 | Chandrasekhar | H01B 1/22 524/404 |
| 2013/0330611 A1 | 12/2013 | Chen et al. | |
| 2014/0072879 A1 | 3/2014 | Chen et al. | |
| 2015/0044556 A1 | 2/2015 | Wang et al. | |
| 2016/0060119 A1 | 3/2016 | Guerfi et al. | |
| 2016/0319165 A1 | 11/2016 | Choi et al. | |
| 2017/0358384 A1 | 12/2017 | Kageyama et al. | |

FOREIGN PATENT DOCUMENTS

| | | |
|---|---|---|
| JP | 5719483 | 3/2015 |
| JP | 2016-130354 | 7/2016 |
| JP | 2016-195048 | 11/2016 |
| WO | 2015/037711 | 3/2015 |
| WO | 2015/094780 | 6/2015 |

* cited by examiner

SILVER-COATED GRAPHITE PARTICLES, SILVER-COATED GRAPHITE MIXED POWDER AND PRODUCTION METHOD THEREFOR, AND CONDUCTIVE PASTE

TECHNICAL FIELD

The present invention relates to silver-coated graphite particles, a silver-coated graphite mixed powder, a method for producing the silver-coated graphite mixed powder, and a conductive paste.

BACKGROUND ART

Conventionally, a conductive paste containing, for example, a silver powder, a binder, and a solvent has been used. However, since silver is expensive, cost may be decreased by changing the entirety or part of the silver powder to a less inexpensive material. For example, a conductive paste containing a silver-coated copper powder, where the silver-coated copper powder contains, as a core material, copper that is less inexpensive than silver, has been used.

The material that is available as the core material is not only copper that is a metal having high conductivity. For example, Patent Literature 1 describes electrodeposition of metals (e.g., copper, nickel, and silver) on the surfaces of particles of carbon black through electroplating.

CITATION LIST

Patent Literature

PTL 1: Japanese Patent Application Laid-Open (JP-A) No. 63-12669

SUMMARY OF INVENTION

Technical Problem

The silver-coated copper powder having copper as the core material has a problem that oxidation of exposed part of copper decreases reliability. Also, elution of copper ions may cause a problem that paste viscosity is increased. In addition, even when a substance obtained by electrically depositing a metal on the surface of the carbon black is used as a filler of the conductive paste, it is difficult to obtain high conductivity because the core material is carbon black in a noncrystalline state.

An object of the present invention is to provide silver-coated graphite particles obtained by coating at least silver on the surfaces of graphite having relatively high conductivity, and being suitably used for a filler of a conductive paste, a silver-coated graphite mixed powder containing the silver-coated graphite particles, a method for producing the silver-coated graphite mixed powder, and a conductive paste having high conductivity and being light and inexpensive.

Solution to Problem

Means for solving the problems are as follows. That is,
<1> A silver-coated graphite mixed powder including:
silver-coated graphite particles each including a graphite particle and silver coated on a surface of the graphite particle,
wherein when a solution obtained by dissolving the silver-coated graphite mixed powder in nitric acid is analyzed through inductively coupled plasma (ICP) emission spectrometry, an amount of silver is 5% by mass or more but 90% by mass or less, an amount of tin is 0.01% by mass or more but 5% by mass or less, and an amount of zinc is 0.002% by mass or more but 1% by mass or less.
<2> The silver-coated graphite mixed powder according to <1>,
wherein the amount of silver is 20% by mass or more but 90% by mass or less and the amount of tin is 0.01% by mass or more but 2% by mass or less.
<3> The silver-coated graphite mixed powder according to <1> or <2>,
wherein a coated graphite ratio that is a rate of the silver-coated graphite particles determined through binarization processing of a backscattered electron image of the silver-coated graphite mixed powder magnified at 100 times is 10% or more.
<4> The silver-coated graphite mixed powder according to any one of <1> to <3>,
wherein a cumulative 50% point of particle diameter ($D_{50}$) of the silver-coated graphite mixed powder based on volume is 1 μm or more but 20 μm or less.
<5> A method for producing a silver-coated graphite mixed powder that includes silver-coated graphite particles each including a graphite particle and silver coated on a surface of the graphite particle, the method including:
subjecting a graphite powder to sensitizing with an aqueous solution of a tin compound; and
coating silver on a surface of the graphite powder after the sensitizing through displacement using a silver complex solution and a zinc powder,
wherein a pH of the silver complex solution is 6 or more but 14 or less.
<6> The method for producing the silver-coated graphite mixed powder according to <5>,
wherein the pH of the silver complex solution is 6 or more but 8 or less.
<7> The method for producing the silver-coated graphite mixed powder according to <5> or <6>,
wherein when a solution obtained by dissolving the silver-coated graphite mixed powder in nitric acid is analyzed through inductively coupled plasma (ICP) emission spectrometry, an amount of silver is 5% by mass or more but 90% by mass or less, an amount of tin is 0.01% by mass or more but 5% by mass or less, and an amount of zinc is 0.002% by mass or more but 1% by mass or less.
<8> The method for producing the silver-coated graphite mixed powder according to any one of <5> to <7>,
wherein a coated graphite ratio that is a rate of the silver-coated graphite particles determined through binarization processing of a backscattered electron image of the silver-coated graphite mixed powder magnified at 100 times is 10% or more.
<9> A conductive paste including:
the silver-coated graphite mixed powder according to any one of <1> to <4>;
a resin; and
an organic solvent.
<10> Silver-coated graphite particles, each including:
a graphite particle; and
silver coated on a surface of the graphite particle,
wherein an average particle diameter of the silver-coated graphite particles observed in a scanning electron microscope image is 1 μM or more but 20 μm or less and a thickness of the silver coated is 10 nm or more but 5 μm or less.

Advantageous Effects of Invention

According to the present invention, it is possible to provide silver-coated graphite particles obtained by coating at least silver on the surfaces of graphite having relatively high conductivity, and being suitably used for a filler of a conductive paste, a silver-coated graphite mixed powder containing the silver-coated graphite particles, a method for producing the silver-coated graphite mixed powder, and a conductive paste having high conductivity and being light and inexpensive.

Figure 1:
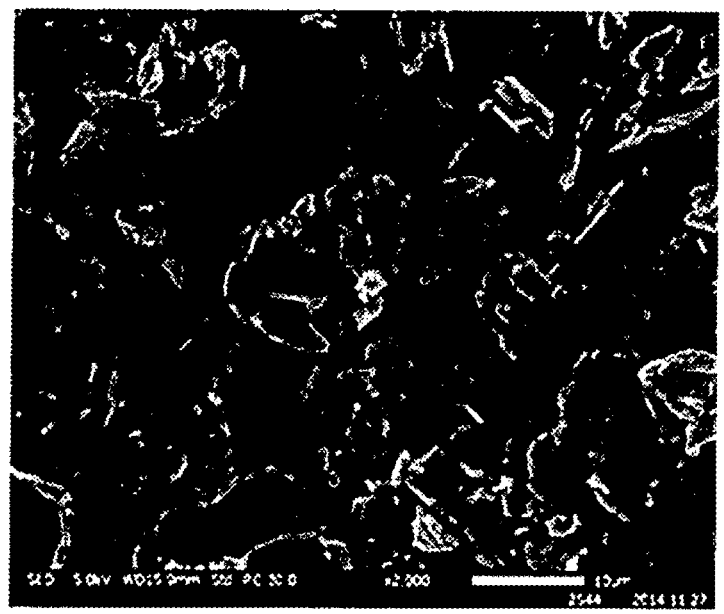
FIG. 1 is a scanning electron microscopic image (×2,000) of a graphite powder used in Example 1.

DESCRIPTION OF EMBODIMENTS (Silver-Coated Graphite Mixed Powder and Silver-Coated Graphite Particles)
A silver-coated graphite mixed powder of the present invention includes silver-coated graphite particles each including a graphite particle and silver coated on a surface of the graphite particle, and further a surface treatment agent may be attached thereon if necessary.

When a solution obtained by dissolving the silver-coated graphite mixed powder in nitric acid is analyzed through inductively coupled plasma (ICP) emission spectrometry, an amount of silver is 5% by mass or more but 90% by mass or less, an amount of tin is 0.01% by mass or more but 5% by mass or less, and an amount of zinc is 0.002% by mass or more but 1% by mass or less.

Silver-coated graphite particles of the present invention are silver-coated graphite particles in which surfaces of graphite particles are coated with silver, and further a surface treatment agent may be attached to the silver-coated graphite particles if necessary.

An average particle diameter (SEM particle diameter) of the silver-coated graphite particles observed in a scanning electron microscope image is 1 µm or more but 20 µm or less and a thickness of the silver coated is 10 nm or more but 5 µm or less.

The present inventors extensively studied a method for coating silver on the graphite particles, and as a result, decided to use a wet method that is highly productive for the method. In the wet method, the present inventors tried to coat silver by simply charging graphite particles into a silver complex solution and then using various reducing agents such as formalin. However, adsorption of the deposited silver to the graphite particles did not occur, and deposition of silver on a beaker and formation of independent silver particles were only observed. In addition, the present inventors considered facilitation of the deposition on the graphite particles by adding tin onto the surfaces of the graphite particles and then tried a sensitizing treatment. In the method, however, the deposition on the surfaces of the graphite particles using a reducing agent was also difficult and the surfaces of the crystallized graphite particles were considerably stable. Therefore, it was not easy to coat silver.

The silver-coated graphite particles of the present invention are conceived based on application of displacement deposition using a base metal, rather than using a reducing agent, and are based on the following findings. Specifically, in the presence of silver ions, zinc particles are charged to graphite particles including tin on the surfaces thereof through a sensitizing treatment. As a result, displacement reaction between silver and zinc occurs when the graphite particles and the zinc particles are close to each other, which makes it possible to deposit silver on the surfaces of the graphite particles. Compared to liquid reducing agents, zinc particles randomly cause the reduction and the deposition. However, this makes it possible to certainly form a core on a part of the graphite particle because the reducing power is unevenly distributed, and thus it is found that this is a method capable of coating silver on a part of the graphite particle. It was found that the thus-obtained silver-coated graphite mixed powder that contains tin and zinc inhibits disadvantages (e.g., increase in viscosity) resulting from addition of graphite and further enhances advantages (e.g., improvement of conductivity and thermal conductivity) resulting from addition of graphite.

<Graphite Powder and Graphite Particles>
The graphite powder is an aggregate of graphite particles that are mainly graphite (e.g., graphite and graphene).
The graphite powder is not particularly limited and may be appropriately selected depending on the intended purpose. The graphite powder is preferably at least one selected from graphene, a spheroidal graphite, and a flake graphite.
The spheroidal graphite and the flake graphite are substances in which carbons are bound in a hexagonal form by the covalent bond and the layers are bound by the van der Waals force.

The graphene is a planar substance having a thickness equivalent to one carbon atom and is constituted with crystal lattices having a honeycomb structure formed by the sp$^2$ bond of carbon atoms. The graphene is a basic building block of graphite materials having any other dimensions.

The graphite powder may be a natural product or an artificial product. An amount of impurity in the graphite powder is not particularly limited and may be appropriately selected depending on the intended purpose, and is preferably 10% by mass or less.

As the graphite powder, an appropriately produced product may be used or a commercially available product may be used. Examples of the commercially available product include graphene (GNH-X2, manufactured by Graphene Platform Corp.), a spheroidal graphite (WF-15C, manufactured by Chuetsu Graphite Works Co., Ltd.), and a flake graphite (BF-15AK, manufactured by Chuetsu Graphite Works Co., Ltd.).

A BET specific surface area of the graphite powder is preferably small. The BET specific surface area is preferably 14 m$^2$/g or less, more preferably 7 m$^2$/g or less. In displacement deposition of silver, the deposited silver core has a size of a primary diameter ranging from several nanometers to several tens nanometers. It is considered that each silver core is connected with each other to coat the surface as growing. At this time, a larger BET specific surface area results in an excess of % by mass of silver (Ag) required to coat silver (Ag) of almost all of the surfaces of the graphite powder. Therefore, as the BET specific surface area is small, it is possible to increase the coat ratio by using a small amount of silver.

The BET specific surface area of the graphite powder can be measured with Macsorb HM-model 1210 (manufactured by MOUNTECH Co.) by the single point BET method using nitrogen adsorption. Note that, in the measurement of the BET specific surface area, degassing before the measurement is performed at 60° C. for 10 minutes.

A cumulative 50% point of particle diameter ($D_{50}$) of the graphite powder based on volume, which is determined through a laser diffraction method, is not particularly limited and may be appropriately selected depending on the intended purpose, and is preferably 1 µm or more but 20 µm or less. When the cumulative 50% point of particle diameter is less than 1 µM or is more than 20 µm, printing property as the conductive paste may be adversely affected.

The cumulative 50% point of particle diameter of the graphite powder can be measured through the particle size distribution measurement of the wet laser diffraction. That is, the particle size distribution measurement of the wet laser diffraction is performed as described below. Specifically, a graphite powder (0.1 g) is added to isopropyl alcohol (40 mL) and is dispersed for 2 minutes with an ultrasonic homogenizer having a tip diameter of 20 mm. Then, the laser diffraction scattering particle size distribution measuring apparatus (MICROTORAC MT3300EXII, manufactured by NIKKISO CO., LTD.) is used for the measurement. Measurement results are graphed to determine frequency and accumulation of the particle size distribution of the graphite powder based on volume. The cumulative 50% point of particle diameter is presented as "$D_{50}$".

<Silver Coating>

As the silver coating, the silver-coated graphite particles may have partially coated portions or entirely coated portions. Under observation with, for example, a scanning electron microscope (SEM), the silver-coated graphite particles on which silver-coated portions are partially observed and the graphite particles on which silver-coated portions are not observed may be mixed. Among the graphite powders used, a rate of the graphite particles which are partially coated with silver is regarded as a coated graphite ratio.

The coated graphite ratio can be obtained as described below. Specifically, when a backscattered electron image of the silver-coated graphite mixed powder magnified at 100 times is observed, contrast of the silver-coated portions on the graphite particles that have been subjected to the silver-coat treatment is observed in white. Therefore, a pseudo-coat ratio (hereinafter, will be referred to as coat ratio (area ratio)) can be obtained by calculating a rate of the silver-coated graphite particles from the area ratio between the silver-coated portion observed in white and the graphite particles observed in black through the binarization processing. In addition, as another method, it is possible to measure, through gravity separation, a rate (mass ratio) of the silver-coated graphite particles in the silver-coated graphite mixed powder. A difference between a density of the silver-coated graphite particles and a density of the graphite particles is used for the gravity separation. Here, a density of silver (Ag) is 10.5 g/mL, whereas a density of graphite is about 2.26 g/mL.

The gravity separation method includes a wet method and a dry method. The wet method is as follows. For example, a heavy solution (aqueous Na polytungstate solution) is prepared so as to have a density of 3 g/mL. By using the heavy solution, the silver-coated graphite particles are precipitated in the heavy solution so long as a ratio of silver in the silver-coated graphite particles is at least 10% by mass or more. Meanwhile, other substances (graphite particles to each of which almost no silver is attached) except for the silver-coated graphite particles are floated. Therefore, a rate of the precipitated particles can be regarded as being equivalent to the rate of the silver-coated graphite particles in the silver-coated graphite mixed powder. Note that, assuming that all of the silver in the solution used for the coating is used for coating silver in the graphite powder and a single substance of silver is not deposited, it is possible to determine a rate (coated graphite ratio) of the silver-coated graphite powder changed from the charged graphite powder, by using a value of a rate (mass ratio) of the silver-coated graphite particles in the silver-coated graphite mixed powder, which is determined through gravity separation.

A rate of the graphite particles covered with silver among the graphite powder in the silver-coated graphite mixed powder of the present invention is preferably high, but does not need to be 100%. The graphite particles that are not coated with silver may be included.

The coated graphite ratio (area ratio), which is a rate of the silver-coated graphite particles determined through binarization processing of a backscattered electron image magnified at 100 times, is preferably 10% or more, more preferably 35% or more. Most preferably, silver uniformly coats all of the graphite particles; i.e., the coated graphite ratio is 100%. Note that, even when the graphite is partially coated with silver, it is possible to attain not only inexpensive cost but also high conductivity at the time when it is used for a conductive paste, by coating silver on the graphite powder.

A BET specific surface area of the silver-coated graphite mixed powder is preferably small, and is preferably, for example, 14 m$^2$/g or less, more preferably 7 m$^2$/g or less. A lower limit of the BET specific surface area is preferably 0.1 m$^2$/g. The BET specific surface area can be measured with, for example, a commercially available measuring instrument of BET specific surface area.

A cumulative 50% point of particle diameter (Dm) of the silver-coated graphite mixed powder based on volume, which is determined by a laser diffraction method, is preferably 1 μm or more but 20 μm or less. When the cumulative 50% point of particle diameter (Dm) is less than 1 μm or is more than 20 μm, printing property as the conductive paste may be adversely affected.

The cumulative 50% point of particle diameter ($D_{50}$) of the silver-coated graphite mixed powder can be measured with, for example, a laser diffraction scattering particle size distribution measuring apparatus (MICROTORAC MT3300EXII, manufactured by NIKKISO CO., LTD.).

The amount of silver (ratio of silver content) in the silver-coated graphite mixed powder, which is determined by analyzing a solution obtained by dissolving the silver-coated graphite mixed powder in nitric acid through inductively coupled plasma (ICP) emission spectrometry, is preferably 5% by mass or more but 90% by mass or less, more preferably 20% by mass or more but 90% by mass or less. When the amount is 5% by mass or more, it is possible to securely deposit silver on the graphite particles. When the ratio of silver content is less than 20% by mass, effects of decreasing the specific resistance may be hardly obtained even after the graphite particle is coated with silver. When the ratio of silver content is more than 90% by mass, there may be less advantages in terms of cost as compared with the silver in an amount of 100% by mass. Note that, regarding a volume ratio calculated from density, the volume ratio of silver in the silver-coated graphite mixed powder is preferably 1% or more, more preferably 5% or more but 66% or less.

The amount of tin is preferably 0.01% by mass or more but 5% by mass or less, more preferably 0.01% by mass or more but 2% by mass or less. The amount of zinc is preferably 0.002% by mass or more but 1% by mass or less. When the amount of tin and the amount of zinc are too high, resistance values may be adversely affected.

<Surface Treatment Agent>

The surface of the silver-coated graphite mixed powder can be coated with a surface treatment agent formed of an organic substance in order to maintain dispersibility and achieve easy compatibility for being formed into a conductive paste.

The surface treatment agent is not particularly limited and may be appropriately selected depending on the intended purpose so long as it is an organic substance. Examples of the surface treatment agent include aliphatic acids, surfactants, organometallic compounds, chelating agents, and polymeric dispersants. These may be used alone or in combination.

When the surface treatment agent is used, one or more kinds of the surface treatment agents are selected and added to a slurry-like reaction system before, after, or during the deposition of silver. As a result, silver-coated graphite particles and a silver-coated graphite mixed powder to each of which the surface treatment agent is attached can be obtained.

(Method for Producing Silver-Coated Graphite Mixed Powder)

A method of the present invention for producing a silver-coated graphite mixed powder is a method for producing a silver-coated graphite mixed powder that includes silver-coated graphite particles each including a graphite particle and silver coated on a surface of the graphite particle. The method includes: a step of subjecting a graphite powder to sensitizing with an aqueous solution of a tin compound; and a step of coating silver on a surface of the graphite powder after the sensitizing through displacement using a silver complex solution and a zinc powder. A pH of the silver complex solution is 6 or more but 14 or less. The method further includes other steps if necessary.

In the method for producing the silver-coated graphite mixed powder, it is preferable that an amount of silver be 5% by mass or more but 90% by mass or less, an amount of tin be 0.01% by mass or more but 5% by mass or less, and an amount of zinc be 0.002% by mass or more but 1% by mass or less, where the amount of silver, the amount of tin, and the amount of zinc are determined by analyzing a solution obtained by dissolving the silver-coated graphite mixed powder in nitric acid through inductively coupled plasma (ICP) emission spectrometry.

A step of performing the sensitizing preferably includes a tin liquid preparation step, a sensitizing step, and a filtration•washing step.

The step of coating silver on a surface of the graphite powder after the sensitizing through displacement using a silver complex solution and a zinc powder preferably includes a silver liquid preparation step, a complexation step, a pH adjusting step, a displacement plating step, a filtration•washing step, and a drying step. It is preferable that the drying step further include a disintegrating step and a classification step.

<Tin Liquid Preparation Step>

The tin liquid preparation step is a step of preparing a reaction liquid of tin. A tin compound is mixed with an acid (e.g., hydrochloric acid) and pure water to prepare an acidic solution containing tin ions.

Examples of the tin compound include tin chloride.

<Sensitizing Step>

The sensitizing step is a step of adsorbing tin on the surfaces of the graphite powder by adding the graphite powder to the acidic solution containing tin ions and stirring the solution. An amount of tin to be adsorbed can be adjusted depending on the formulation of the liquid preparation and the reaction time, and can be, for example, 0.1% by mass or more but 5% by mass or less.

<Filtration•Washing Step>

The filtration•washing step is a step of obtaining a graphite powder on the surface of which tin is adsorbed by filtrating a slurry obtained in the sensitizing step, followed by washing with water. Note that, in the subsequent step, the surfaces of the graphite powder need to be active. Therefore, the graphite powder does not need to be dried.

<Silver Liquid Preparation Step>

The silver liquid preparation step is a step of preparing a reaction liquid of silver.

A silver compound-containing aqueous solution can be obtained by charging a silver compound into a reaction vessel in which pure water has been stirred and then stirring the resultant solution.

Examples of the silver compound include silver nitrate, silver carbonate, and silver acetate. These may be used alone or in combination thereof. Among them, silver nitrate is preferable in terms of cost, for example.

<Complexation Step>

The complexation step is a step of complexing silver in the silver compound-containing aqueous solution obtained in the silver liquid preparation step.

In the complexation step, a silver complex solution can be obtained by complexing silver in the silver compound-containing aqueous solution obtained in the silver liquid preparation step.

The method of complexation is, for example, a method of complexation using a silver-complexing agent.

The silver-complexing agent is preferably, for example, a strong alkaline chelating compound such as EDTA-4Na. The reason for this is because it is not easy to deposit silver on the graphite powder and it is difficult for an ammonia-based complexing agent that is frequently used as the silver-complexing agent to deposit silver onto the graphite powder. Note that, addition of the graphite powder that has undergone the sensitizing step is performed before or immediately after the complexation step. The displacement reaction is not initiated even when the addition is performed.

<pH Adjusting Step>

In the pH adjusting step, a pH of the silver complex solution is preferably 6 or more but 14 or less, more preferably near neutral; i.e., 6 or more but 8 or less.

When a strong alkaline chelating compound such as EDTA-4Na is used, displacement reaction between silver (Ag) and zinc (Zn) in the subsequent displacement plating step is rapid. When the displacement reaction is rapid, only graphite powder that is fortunately adsorbed to Zn powder involves the displacement reaction, deteriorating homogeneity of the Ag coat. The silver complex solution exhibiting nearly neutrality slows the displacement reaction down and then increases adsorption frequency between the Zn powder and the graphite powder. As a result, it is possible to increase the rate (coat ratio) of the graphite coated with Ag in the graphite powder charged. Note that, the silver complex solution having a pH of less than 6 is not preferable because an effect of the sensitizing is lost to thereby drastically decrease the coat ratio.

The pH adjustment is preferably performed with, for example, an acid such as nitric acid. When an ammonium-based substance is used for the adjustment, the Ag coated surfaces tend to change into the unevenly particulate surfaces, resulting in inhibition of growth of silver in a transverse direction.

<Displacement Plating Step>

The displacement plating step is a step of plating silver on the surfaces of the graphite powder by adding a zinc powder to a silver complex solution in the state of stirring the graphite powder added to the silver complex solution before or after the complexation step, to thereby cause the displacement-reduction reaction.

In the place where zinc (Zn) that is a baser metal than silver (Ag) exists, it is believed that the following reaction formula 1 occurs.

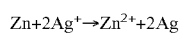

$$Zn+2Ag^+ \rightarrow Zn^{2+}+2Ag \qquad \text{Reaction formula 1}$$

Deposition of silver on the graphite powder is not easy. Even when a reducing agent (e.g., formalin, glucose, and KNa tartrate) is used, the coating of silver on the graphite powder is hardly found. Therefore, instead of displacement reaction using a reducing agent, displacement plating by the displacement reaction using the above-described metal that is baser than silver (Ag) is preferably used. Examples of the metal that is baser than silver (Ag) include magnesium, aluminum, zinc, iron, nickel, tin, lead, and copper. Among them, zinc is particularly preferable because it is hardly oxidized and handling of its powder is easy.

<Filtration•Washing Step, Drying Step, Disintegrating Step, and Classification Step>

A mass cake having almost no fluidity can be obtained by filtrating the slurry obtained in the displacement step, followed by washing with water. In the above displacement plating step, a part of tin adsorbed on the graphite powder is released and a part of the Zn powder added is ionized. Tin and zinc dispersed in water are mainly separated and removed from the silver-coated graphite mixed powder during the filtration and the washing with water. However, another part of tin and zinc remains together with the silver-coated graphite mixed powder. In order to, for example, facilitate drying of the cake and prevent aggregation during the drying, water in the cake may be displaced with, for example, a lower alcohol or polyol. After the cake is dried with a drying machine such as a forced circulation-type air drying machine, a vacuum drying machine, or a flush drying apparatus and then is disintegrated to obtain a silver-coated graphite mixed powder. Instead of the disintegration, a surface smoothing treatment may be performed. The surface smoothing treatment is as follows. Specifically, the silver particles are charged into an apparatus capable of automatically fluidizing particles. Then, the particles are automatically allowed to collide with each other to thereby smooth uneven portions or angular portions of the surfaces of the particles. After the disintegration and the surface smoothing treatment, a classification treatment may be performed. Note that, an integrated apparatus (for example, drymeister and microndryer, manufactured by HOSOKAWA MICRON CORPORATION) capable of performing drying•pulverization•classification may be used to perform the drying, the pulverization, and the classification.

(Conductive Paste)

A conductive paste of the present invention includes the silver-coated graphite mixed powder of the present invention, a resin, and an organic solvent, further includes other components if necessary. For example, a silver powder other than the above, a conductive powder such as a silver-coated copper powder, or glass frit may be additionally mixed in the conductive paste.

<Resin>

The resin is not particularly limited and may be appropriately selected depending on the intended purpose. Examples of the resin include cellulose derivatives such as methyl cellulose and ethyl cellulose, acrylic resins, alkyd resins, polypropylene resins, polyurethane resins, rosin resins, terpene resins, phenol resins, aliphatic petroleum resins, acrylic ester resins, xylene resins, coumarone-indene resins, styrene resins, dicyclopentadiene resins, polybutene resins, polyether resins, urea resins, melamine resins, vinyl acetate resins, polyisobutyl resins, olefin-based thermoplastic elastomer (TPO), and epoxy resins. These may be used alone or in combination. Among them, epoxy resins are preferable in terms of curing ability, close adhesiveness, and versatility.

An amount of the resin is not particularly limited and may be appropriately selected depending on the intended purpose.

<Organic Solvent>

The organic solvent is not particularly limited and may be appropriately selected depending on the intended purpose. Examples of the organic solvent include toluene, methyl ethyl ketone, methyl isobutyl ketone, tetradecane, tetralin, propyl alcohol, isopropyl alcohol, terpineol, dihydroterpineol, dihydroterpineol acetate, ethyl carbitol, butyl carbitol, ethyl carbitol acetate, butyl carbitol acetate, 2,2,4-trimethyl-1,3-pentanediol monoisobutyrate, and diethylene glycol mono-n-ethyl ether acetate. These may be used alone or in combination.

An amount of the organic solvent is not particularly limited and may be appropriately selected depending on the intended purpose.

<Other Components>

The other components are not particularly limited and may be appropriately selected depending on the intended purpose. Examples of the other components include surfactants, dispersing agents, dispersion stabilizers, viscosity modifiers, leveling agents, and antifoaming agents.

The method for producing the conductive paste is not particularly limited and may be appropriately selected depending on the intended purpose. For example, the conductive paste can be prepared by mixing the silver-coated graphite mixed powder of the present invention, the resin, and the organic solvent with, for example, an ultrasonic disperser, a disper, a triple roll mill, a ball mill, a bead mill, a biaxial kneader, or a planetary centrifugal stirrer.

An amount of the silver-coated graphite mixed powder in the conductive paste is not particularly limited and may be appropriately selected depending on the intended purpose, and is preferably adjusted so that viscosity of the conductive paste at 25° C. is 10 Pas or more but 1,000 Pas or less. When the viscosity is less than 10 Pa·s, "bleeding" may occur in the low viscosity region. When the viscosity is more than 1,000 Pa·s, the printing defect of "blurring" may occur in the high viscosity region. Also, the viscosity of the conductive paste can be adjusted, in other ways than adjusting the amount of the silver-coated graphite mixed powder, by adding such as a viscosity modifier and changing kind of the solvent.

The silver-coated graphite particles and the silver-coated graphite mixed powder of the present invention can be suitably used as a conductive paste for forming electrodes and circuits of various electronic components.

The conductive paste of the present invention containing the silver-coated graphite mixed powder of the present invention has high conductivity and is light and inexpensive. Therefore, it can be widely used for forming electrodes and circuits of various electronic components.

EXAMPLES

The present invention will be described in details by way of the following Examples. However, the present invention should not be construed as being limited to these Examples.

Methods for measuring the filler (silver powder, graphite powder, and silver-coated graphite mixed powder) for the BET specific surface area, the tap density, and the particle size distribution ($D_{10}$, $D_{50}$, and $D_{90}$) are as follows.

<BET Specific Surface Area>

The BET specific surface area of the filler was measured with Macsorb HM-model 1210 (manufactured by MOUNTECH) through the single point BET method using nitrogen adsorption. Note that, in the measurement of the BET specific surface area, degassing before the measurement was performed at 60° C. for 10 minutes.

<Tap Density>

A tap density of the filler was obtained with a tap density measuring device (bulk specific gravity measuring device SS-DA-2, manufactured by Shibayama Scientific Co., Ltd.). The filler was weighed and was charged into a container (20 mL test tube). The tapping was performed for 1,000 times at a drop of 20 mm. The tap density was calculated by the following formula.

The tap density=Mass of the sample (g)/Volume of the sample after tapping

Note that, the volume of the silver-coated graphite mixed powder is greatly changed depending on the rate of silver. Therefore, in order to uniform the volume of each sample, a sample mass relative to the amount of silver was changed as described below. Specifically, the sample mass relative to the amount of silver was 2.5 g when the amount of silver was about 50% by mass in Example 1, the sample mass relative to the amount of silver was 8.5 g when the amount of silver was about 70% by mass in Example 2, and the sample mass relative to the amount of silver was 15 g when the amount of silver was about 90% by mass in Example 3.

<Particle Size Distribution ($D_{10}$, $D_{50}$, and $D_{90}$)>

The particle size distribution was determined with a measurement device of laser diffraction scattering particle size distribution apparatus (MICROTORAC MT3300EXII, manufactured by NIKKISO CO., LTD.). Specifically, a filler (0.1 g) was added to isopropyl alcohol (40 mL) and was dispersed with an ultrasonic homogenizer having a chip diameter of 20 mm for 2 minutes to prepare a sample. Then, the particle diameter was measured under the total reflection mode. Then, values of a cumulative 10% point of particle diameter ($D_{10}$), a cumulative 50% point of particle diameter ($D_{50}$), and a cumulative 90% point of particle diameter (DO were determined by the cumulative distribution based on volumes obtained through the measurement.

Example 1

—Preparation of Silver-Coated Graphite Mixed Powder—
<Sensitizing Step>

Into a 300 mL-beaker, tin chloride dihydrate ($SnCl_2 \cdot 2H_2O$, 0.105 mol/L) (4.76 g), hydrochloric acid (0.408 mol/L) (8 g), and pure water (199.36 g) were charged to prepare a tin compound solution. Then, the solution prepared was transferred to a 500 mL-beaker and a graphite powder (10 g) was added thereto. The resultant solution was maintained for 2 hours under stirring at room temperature (25° C.) to adsorb Sn ions on the surfaces of the graphite powder.

Next, filtration was performed on filter paper (5C) using Nutsche. The washing with pure water was performed until conductance of the filtrate became 0.5 µS/m or less.

A BET specific surface area of the graphite powder was 13.3 m²/g, a tap density of the graphite powder was 0.31 g/mL, and a cumulative 50% by mass point of particle diameter ($D_{50}$) based on volume of the graphite powder was 8.3 µm. FIG. 1 presents a scanning electron microscopic image (×2,000) of the graphite powder used in Example 1.

<Displacement Plating Step>

Liquid preparation was performed (25° C.) by charging silver nitrate into a 1,000 mL-beaker in which pure water was being stirred at the number of the rotation of 524 rpm so as to be an aqueous silver nitrate solution (450 mL) containing silver nitrate (0.185 mol/L) at the time of displacement reaction, considering an amount of water to be added until addition of Zn powder.

Then, with the graphite powder after the sensitizing step being not dried, an amount equivalent to the nine-tenth was picked up and charged so that it was 9 g in terms of the graphite of a raw material. A mass ratio between the silver and the graphite powder as the raw material in the aqueous silver nitrate solution was 1:1.

Next, to this reaction vessel, EDTA-4Na as the complexing agent was added in an amount of 2.67 equivalents in terms of a molar ratio relative to an amount of silver in the solution and was allowed to react for 5 minutes to obtain an aqueous silver-EDTA complex solution. When the aqueous silver-EDTA complex solution was measured for pH, it exhibited 13.4. Without adjustment of pH, Zn powder (2 mm to 5 mm foil) was added thereto at one time in an amount of 3 equivalents in terms of the molar ratio relative to the amount of silver in the solution with the solution being stirred for 20 minutes to perform the displacement plating.

Then, the resultant was allowed to pass through a sieve having a scale spacing of 150 µm to collect the remaining Zn powder. The filtration was performed under pressure on a filter paper (5C) and washing with pure water was performed until conductance of the filtrate became 0.5 µS/m or less. Then, the thus-obtained product was dried for 5 hours in a vacuum drying machine at 70° C. to obtain a silver-coated graphite mixed powder of Example 1.

The silver-coated graphite mixed powder obtained was picked up in an amount of 0.5 g and was dissolved with heat in nitric acid. Then, the resultant mixture was filtrated to obtain a solution in which substances other than the graphite powder were dissolved. As a result of measuring the solution through the inductively coupled plasma (ICP) emission spectrometry (SPS5100, manufactured by SII), the amount of silver was 49% by mass, the amount of zinc was 0.44% by mass, the amount of tin was 0.9% by mass, in the silver-coated graphite mixed powder.

Example 2

A silver-coated graphite mixed powder of Example 2 was obtained in the same manner as in Example 1, except that the aqueous solution was prepared so as to be an aqueous solution (650 mL) containing silver nitrate (0.249 mol/L) at the time of displacement reaction; the amount of the graphite powder after the sensitizing step to be added was an amount of 7.5 g in terms of the graphite powder as the raw material; and a mass ratio between the silver and the graphite powder as the raw material in the aqueous silver nitrate solution was 7:3.

When the silver-coated graphite mixed powder obtained was subjected to quantitative analysis through ICP in the same manner as in Example 1, the amount of silver was 69% by mass, the amount of zinc was 0.27% by mass, and the amount of tin was 0.33% by mass, in the silver-coated graphite mixed powder.

Example 3

A silver-coated graphite mixed powder of Example 3 was obtained in the same manner as in Example 1, except that the aqueous solution was prepared so as to be an aqueous solution (800 mL) containing silver nitrate (0.333 mol/L) at the time of displacement reaction; the amount of the graphite powder after the sensitizing step to be added was an amount of 3.2 g in terms of the graphite powder as the raw material; and a mass ratio between the silver and the graphite powder as the raw material in the aqueous silver nitrate solution was 9:1.

When the silver-coated graphite mixed powder obtained was subjected to quantitative analysis through ICP in the same manner as in Example 1, the amount of silver was 89% by mass, the amount of zinc was 0.18% by mass, and the amount of tin was 0.044% by mass, in the silver-coated graphite mixed powder.

The amounts of silver (Ag) (silver content ratio) in the silver-coated graphite mixed powders obtained in Examples 1 to 3 were 49% by mass, 69% by mass, and 89% by mass, respectively. It was considered that almost all of the silver in the aqueous silver nitrate solution was deposited on the surfaces of the graphite powder.

The amounts of tin (Sn) in the silver-coated graphite mixed powders obtained in Examples 1 to 3 were 0.9% by mass, 0.33% by mass, and 0.044% by mass, respectively. The larger the amount of silver was, the less the amount of tin was. Therefore, it was considered that the tin attached on the surfaces through the sensitizing was released in the solution after it contributed to deposition of silver.

The amounts of zinc in the silver-coated graphite mixed powders obtained in Examples 1 to 3 were 0.44% by mass, 0.27% by mass, and 0.18% by mass, respectively. As presented in the present invention, it was found that when Zn powder was used for displacement reaction, the zinc was contained as an impurity.

Next, backscattered electron images (hereinafter, will be referred to as a BEC image) of the silver-coated graphite mixed powders of Examples 1 to 3, which were magnified at 100 times and observed with a scanning electron microscope (SEM) (JSM IT3000, manufactured by JEOL Ltd.), are presented in FIGS. 2 to 4.

Figure 2:
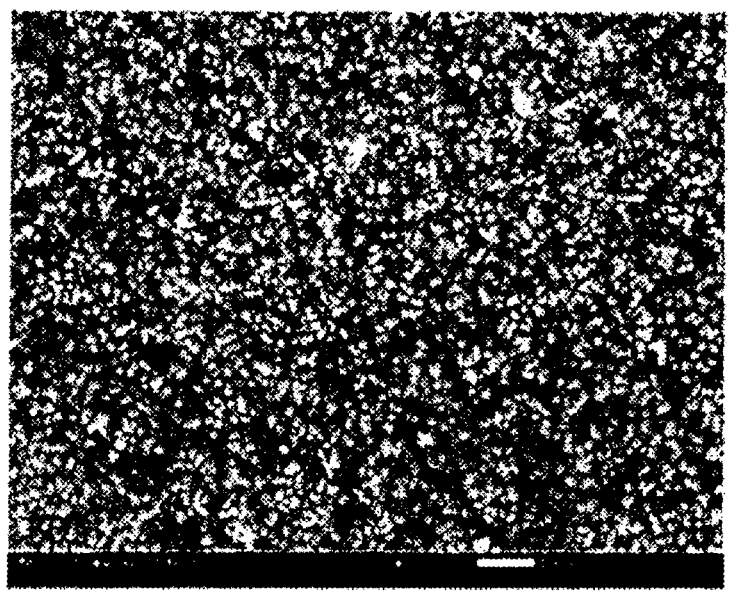
FIG. 2 is a backscattered electron image (×100) of a silver-coated graphite mixed powder of Example 1.
Figure 3:
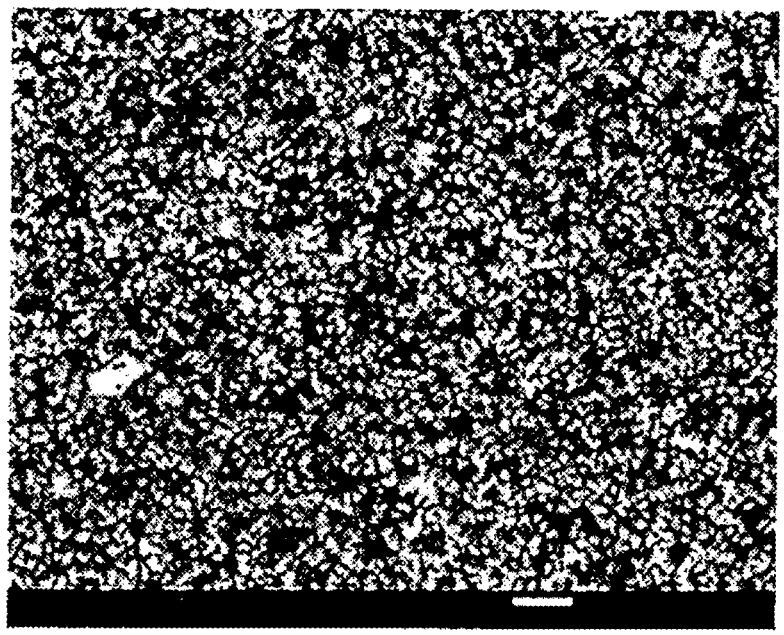
FIG. 3 is a backscattered electron image (×100) of a silver-coated graphite mixed powder of Example 2.
Figure 4:
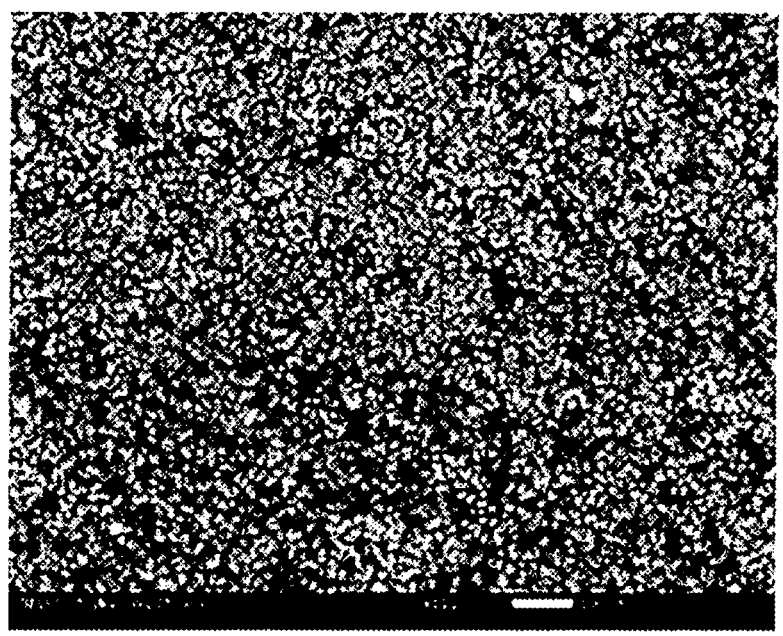
FIG. 4 is a backscattered electron image (×100) of a silver-coated graphite mixed powder of Example 3.

As seen in FIGS. 2 to 4, the particles observed in white (light gray) were the silver-coated graphite particles and the portions observed in black (dark gray) were the graphite particles as the raw material, which were not covered with silver. As presented in these figures, as a result of increasing the amount of silver in the silver-coated graphite mixed powder from Example 1 to Example 3, the rate of the silver-coated graphite particles with respect to the entire graphite powder was increased.

Then, each of the silver-coated graphite mixed powders of Examples 1 to 3 was subjected to image analysis using particle analysis software (RegionAdviser, manufactured by SYSTEM IN FRONTIER INC.). In the image analysis, after the COMPO image was treated with smoothing, contrast was adjusted to 100 and brightness was adjusted to between 60 and 100 in an automatic contrast•brightness adjusting part (ACB). The thus-obtained image was subjected to binarization processing by using a histogram mode based on the regional division (histogram of luminance values on the image was made and binarizaiton processing treatment was performed based on the tendency of the histogram).

As a result of calculating an area ratio after the binarization processing, the coat ratios (area ratio) were 16%, 36%, and 50%.

In Examples 1 and 2, each silver-coated graphite mixed powder was added to Na polytungstate heavy solution adjusted to a density of 3 g/mL and was dispersed through ultrasonic wave. The resultant solution was left to stand for 10 days to bring about gravity separation. The floated powder and the precipitated powder were each filtrated and collected for the measurement. As a result, among the silver-coated graphite mixed powder, rates (mass ratio) of the precipitated powder that was precipitated due to the larger density than the density of 3 g/mL were 73% and 90%. As described above, silver (Ag) has a density of 10.5 g/mL, whereas graphite has a density of about 2.26 g/mL. Therefore, the rate of this precipitated powder was regarded as a rate (mass ratio) of the silver-coated graphite particles in the silver-coated graphite mixed powder.

Assuming that all of the silver in the aqueous silver nitrate solution had been used for silver coating, rates (coated graphite ratio) of silver coated in the graphite powder, which were calculated from the rate (mass ratio) of the silver-coated graphite particles in the silver-coated graphite mixed powder, were each 46% in Example 1 and 66% in Example 2.

Figure 5:
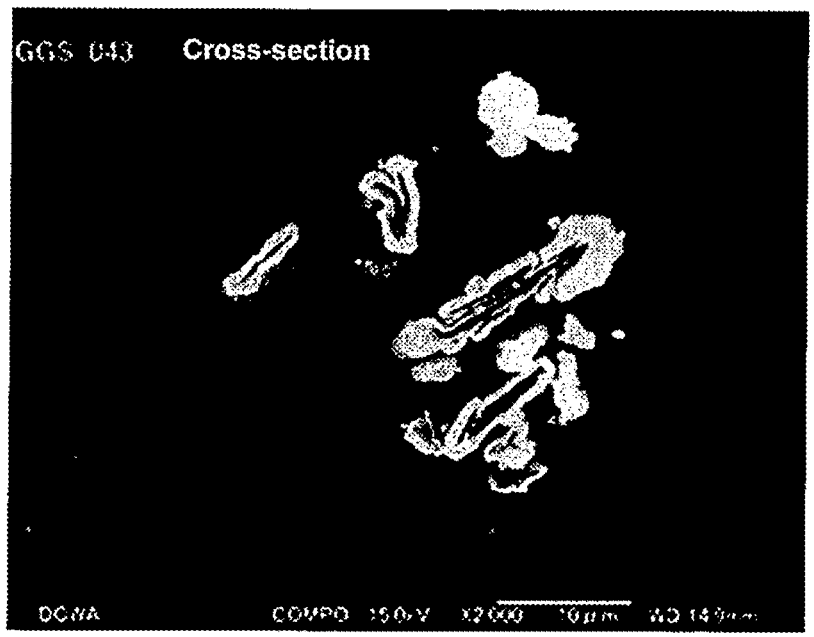
FIG. 5 is a backscattered electron image of a cross-section of the silver-coated graphite mixed powder of Example 3 embedded in a resin.

The silver-coated graphite mixed powder of Example 3 was embedded in a resin and a cross-section of the powder embedded in the resin observed in a BEC image is presented in FIG. 5. Portions exhibiting light contrast in the cross-section are silver and the graphite particles were coated with silver. A thickness of the silver coated was found to have an uneven thickness of from 10 nm to 3 µm (3,000 nm).

Comparative Examples 1 to 3

Cases where a graphite powder and a silver powder similar to the graphite powder in shape were mixed were Comparative Examples 1 to 3 and evaluated for effectiveness of the silver-coated graphite mixed powder.

<Evaluation of Pellet Measurement>

The graphite powder, the graphite powders of Examples 1 to 3, and graphite powders of Comparative Examples 1 to 3 were provided. Here, the graphite powders of Comparative Examples 1 to 3 were obtained by mixing the graphite powder and a silver powder (flaky silver powder, FA-D-6, manufactured by DOWA Electronics Materials Co.) with a coffee mill in the same Ag amounts as in Examples 1 to 3.

Figure 6:
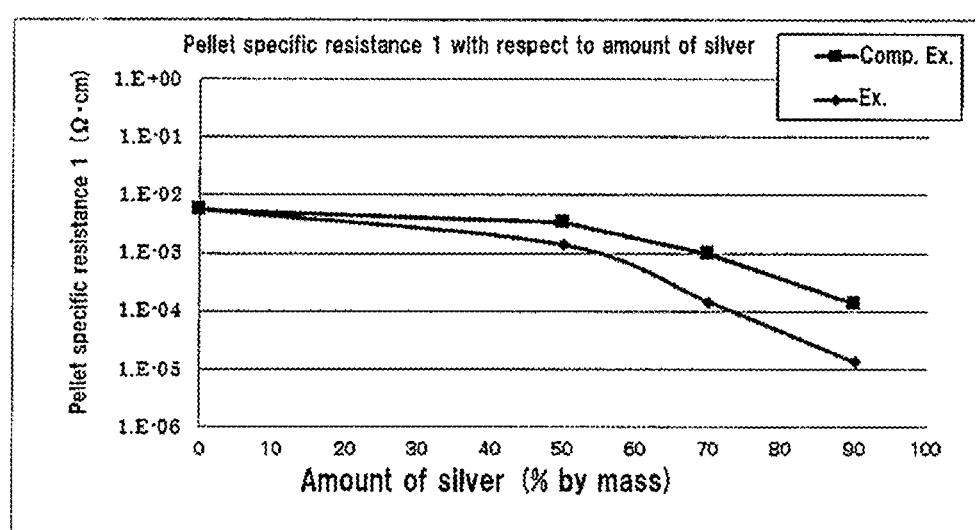
FIG. 6 is a graph presenting a relationship between an amount of silver and specific resistance 1.

Next, each filler was charged into a cylindrical cylinder having a diameter of 10.6 mm and was retained for 1 minute at a pressure of 2.65 t to prepare a pellet having such a size that can be measured for specific resistance 1. The compressed powder body was evaluated for the specific resistance 1 with LorestaHP (MCP-T410, manufactured by MITSUBISHI CHEMICAL). Values (e.g., amount of silver (Ag) of each filler, volume ratio of silver (Ag) of each filler, size of each pellet, density of each pellet, filling ratio, and specific resistance 1) are presented in Table 1. A relationship between the Ag amount and the specific resistance 1 is presented in FIG. 6.

manufactured by EXAKT) with the solvent (BCA) (2.3 parts by mass) being added thereto, to thereby prepare a conductive paste.

Next, the conductive paste obtained was subjected to screen printing so that a linear pattern (width: 500 μm×length: 37,500 μm) was formed on an alumina substrate. Then, it was cured at 200° C. for 40 minutes to prepare a conductive film.

—Measurement of Specific Resistance 2—

A contact-type surface roughness tester (SE-30D, manufactured by Kosaka Laboratory Ltd.) was used to measure the conductive film obtained for a film thickness and a line width. A line resistance (Q) was measured with a digital multimeter (R6551, manufactured by ADVANTEST) to calculate specific resistance 2 (Ω·cm).

The conductive film including the silver-coated graphite mixed powder of Example 1 had a film thickness of 17.8 μm, a line width of 500 μm, and specific resistance 2 of 0.31 Ω·cm.

In the case of the mixed powder of Comparative Example 1, the film thickness was 17.7 μm, the line width was 500 μm, and the specific resistance 2 was 0.43 Ω·cm.

TABLE 1

| | Amount of silver (% by mass) | Volume ratio of silver (%) | Thickness (mm) | Diameter (mm) | Mass (g) | Density (g/mL) | Filling ratio (%) | Specific resistance 1 (Ω · cm) |
|---|---|---|---|---|---|---|---|---|
| Graphite powder | 0 | 0 | 3.08 | 10.68 | 0.4965 | 1.8 | 79.6 | 5.7E−03 |
| Example 1 | 50 | 17.7 | 3.79 | 10.68 | 0.995 | 2.9 | 45.9 | 1.4E−03 |
| Example 2 | 70 | 33.4 | 2.82 | 10.62 | 0.9963 | 4.0 | 49.7 | 1.4E−04 |
| Example 3 | 90 | 66 | 2.07 | 10.62 | 0.9978 | 5.4 | 56.2 | 1.3E−05 |
| Comparative Example 1 | 50 | 17.7 | 3.68 | 10.69 | 1.0033 | 3.0 | 47.6 | 3.4E−03 |
| Comparative Example 2 | 70 | 33.4 | 2.73 | 10.68 | 0.9949 | 4.1 | 50.7 | 1.0E−03 |
| Comparative Example 3 | 90 | 66 | 1.77 | 10.66 | 0.9888 | 6.3 | 64.7 | 1.3E−04 |

From the results of the evaluation of pellet measurement in Table 1, it was found that each of the silver-coated graphite mixed powders had lower specific resistance 1 compared to the cases where the graphite powder and the silver powder were mixed. From the results of FIG. 6, when the amount of silver (Ag) is less than 40% by mass, it was indicated that an effect of decreasing the specific resistance 1 of the silver-coated graphite mixed powder was small compared to the case of the graphite powder alone and the cases where the graphite powder and the silver powder were mixed.

<Paste Evaluation>

Example 1 and Comparative Example 1 were provided. The Comparative Example 1 is a case where the graphite powder and a silver powder (flaky silver powder, FA-D-6, manufactured by DOWA Electronics Materials Co., Ltd.) were mixed with a coffee mill in the same amount of silver (Ag) as in Example 1.

Each (70 parts by mass) of the fillers of Example 1 and Comparative Example 1, an epoxy resin ((EP4901E, manufactured by ADEKA Corporation) (45 parts by mass), a curing agent (BF$_3$NH$_2$EtOH, manufactured by Wako Pure Chemical Industries, Ltd.) (2.25 parts by mass), and a solvent (BCA: butyl carbitol acetate, manufactured by Wako Pure Chemical Industries, Ltd.) (7 parts by mass) were mixed and were kneaded with a triple roll mill (EXAKT80S, It was found that also in the paste evaluation, the silver-coated graphite mixed powder had lower specific resistance 2 compared to the products obtained by mixing the graphite powder and the silver powder.

Hereinafter, means for improving the coat ratio with respect to Example 1 will be described by way of the following Experimental Examples.

Experimental Example 1

A silver-coated graphite mixed powder of Experimental Example 1 was obtained in the same manner as in Example 1 except that before addition of the Zn powder, nitric acid (HNO$_3$) was added so as to be an amount of 1.27 as a molar ratio relative to EDTA-4 Na; and the pH adjustment was performed. A pH after the pH adjustment was 7.2.

The silver-coated graphite mixed powder obtained was picked up in an amount of 0.5 g and was immersed in nitric acid. Then, the resultant was filtrated to obtain a solution in which substances other than the graphite powder were dissolved. When the solution was used for measurement of quantitative analysis through ICP in the same manner as in Example 1, the amount of silver was 47% by mass, the amount of zinc was 0.0035% by mass, and the amount of tin was 0.39% by mass, in the silver-coated graphite mixed powder.

Figure 7:
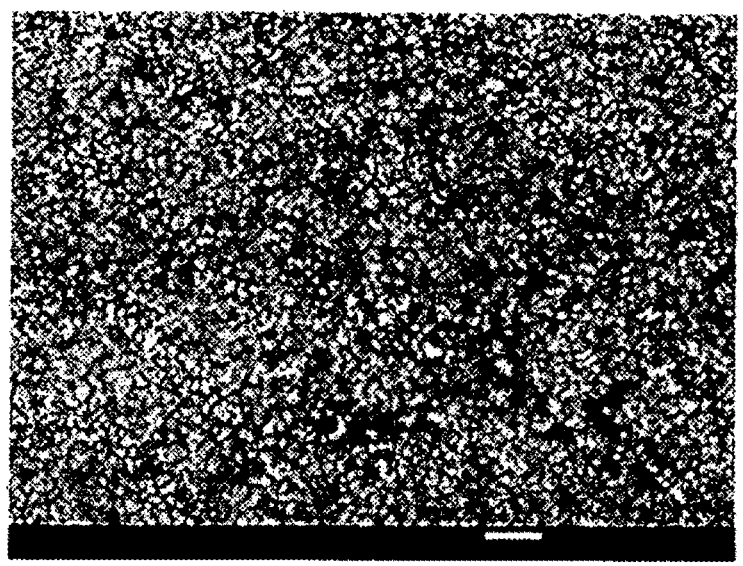
FIG. 7 is a backscattered electron image (×100) of a silver-coated graphite mixed powder of Experimental Example 1.
Figure 8:
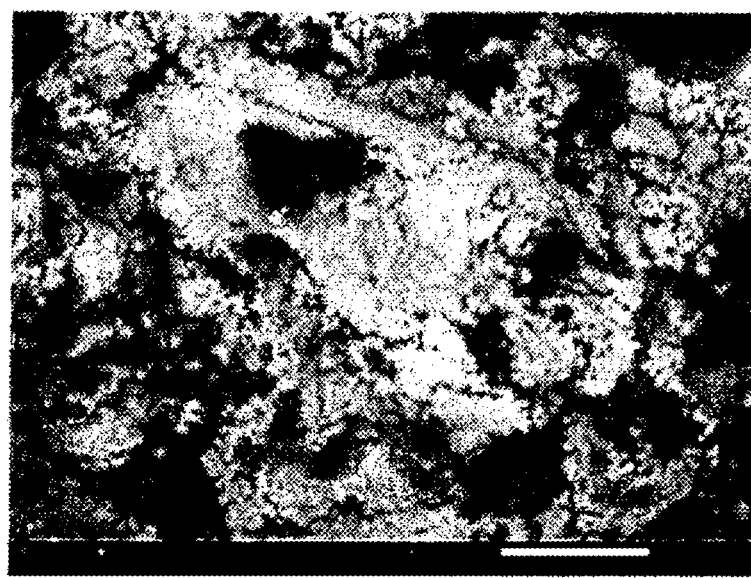
FIG. 8 is a backscattered electron image (×5,000) of a silver-coated graphite mixed powder of Experimental Example 1.

BEC images of the silver-coated graphite mixed powder obtained in Experimental Example 1, which are magnified at 100 times and 5,000 times, are presented in FIGS. 7 and 8. A rate (coat ratio (area)) of the silver-coated graphite particles was 54%. By bringing the pH close to neutral, a rate of white (silver-coated graphite particles) was drastically increased compared to the coat ratio (area) of 16% in Example 1 and the coat ratio was found to be high, compared to Example 1 without the pH adjustment. A coat ratio (mass ratio) that is a rate of the precipitated powder after gravity separation was 79% by mass, which was increased compared to the coat ratio (mass ratio) of 73% by mass in Example 1.

Experimental Example 2

A silver-coated graphite mixed powder of Experimental Example 2 was obtained in the same manner as in Example 1 except that before addition of the Zn powder, nitric acid ($HNO_3$) was added so as to be 1.64 as a molar ratio relative to EDTA-4Na; and the pH adjustment was performed. A pH after the pH adjustment was 4.5.

The silver-coated graphite mixed powder obtained was picked up in an amount of 0.5 g and was immersed in nitric acid. Then, the resultant was filtered to obtain a solution in which substances other than the graphite powder were dissolved. When the solution was used for measurement of quantitative analysis through ICP in the same manner as in Example 1, the amount of silver was 51% by mass, the amount of zinc was 0.0052% by mass, and the amount of tin was 0.4% by mass, in the silver-coated graphite mixed powder.

Figure 9:
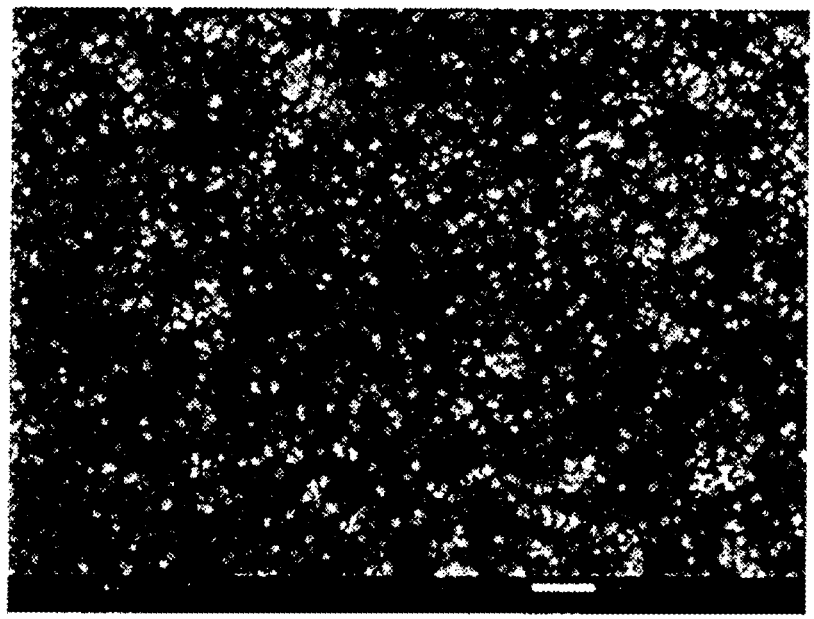
FIG. 9 is a backscattered electron image (×100) of a silver-coated graphite mixed powder of Experimental Example 2.
Figure 10:
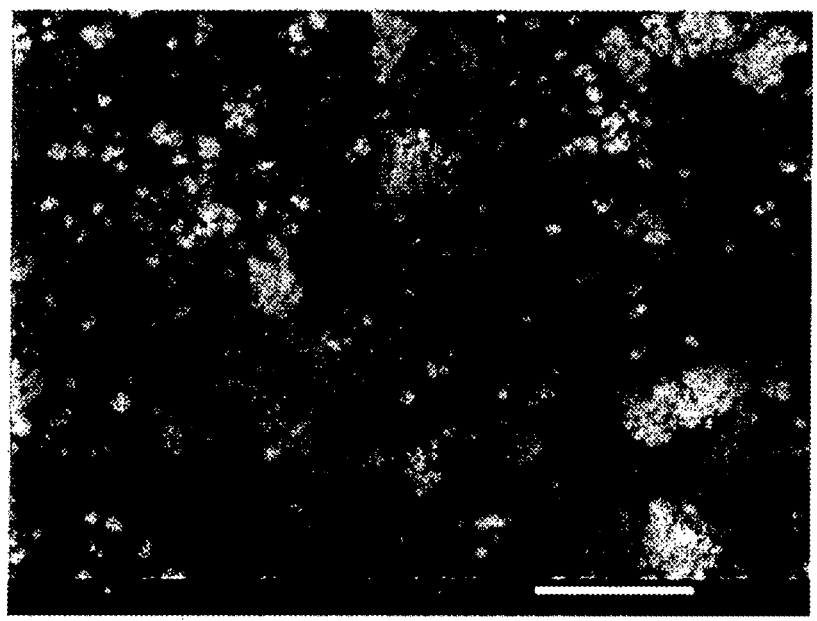
FIG. 10 is a backscattered electron image (×5,000) of a silver-coated graphite mixed powder of Experimental Example 2.

BEC images of the silver-coated graphite mixed powder obtained in Experimental Example 2, which are magnified at 100 times and 5,000 times, are presented in FIGS. 9 and 10. A rate (coat ratio (area)) of the silver-coated graphite particles was 8%. Because the pH was lowered to the acid region compared to Example 1 without the pH adjustment, the rate of white (silver-coated graphite particles) was drastically decreased, the amount of the graphite powder that was not coated with silver was found to be large. In addition, the coat ratio (mass ratio) that is a rate of the precipitated powder after gravity separation was 55% by mass, which was decreased compared to the coat ratio (mass ratio) of 73% by mass in Example 1.

Experimental Example 3-1

A silver-coated graphite mixed powder of Experimental Example 3-1 was obtained in the same manner as in Example 1 except that the graphite powder was changed to the flake graphite (BF-15AK, manufactured by Chuetsu Graphite Works Co., Ltd.).

Figure 11:
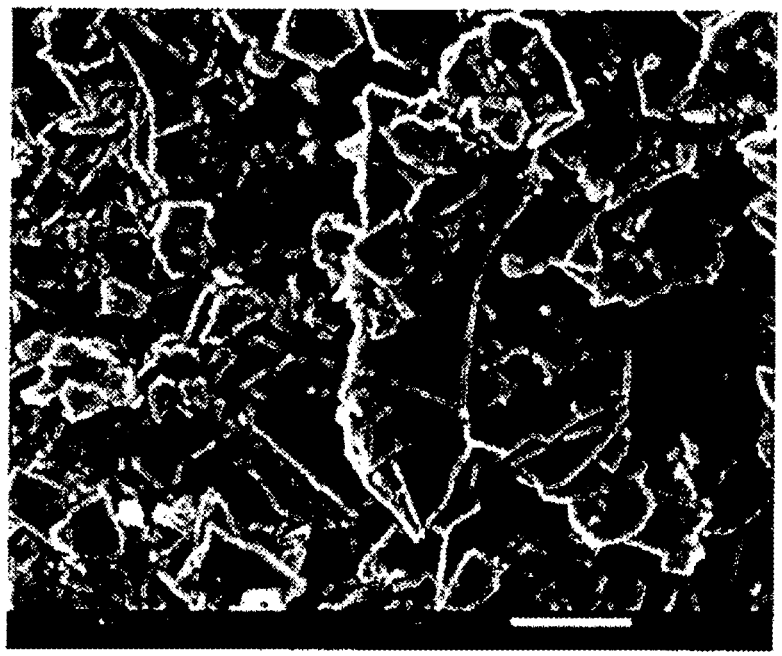
FIG. 11 is a scanning electron microscopic image (×2,000) of a flake graphite used in Experimental Example 3-1.

A BET specific surface area of the flake graphite was 5.44 $m^2/g$, a tap density of the flake graphite was 0.32 g/mL, and a cumulative 50% point of particle diameter ($D_{50}$) based on volume was 15.7 μm. FIG. 11 presents a scanning electron microscopic image (×2,000) of the flake graphite used in Experimental Example 3-1.

The silver-coated graphite mixed powder obtained was picked up in an amount of 0.5 g and was immersed in nitric acid. Then, the resultant was filtrated to obtain a solution in which substances other than the graphite powder were dissolved. When the solution was used for measurement of quantitative analysis through ICP in the same manner as in Example 1, the amount of silver was 52% by mass, the amount of zinc was 0.23% by mass, and the amount of tin was 0.046% by mass, in the silver-coated graphite mixed powder.

Figure 12:
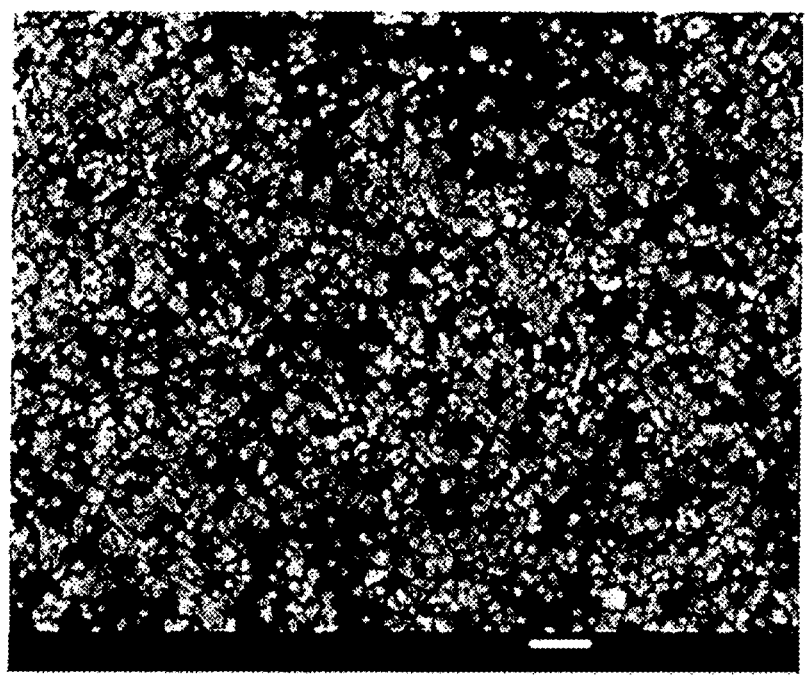
FIG. 12 is a backscattered electron image (×100) of a silver-coated graphite mixed powder of Experimental Example 3-1.

A BEC image of the silver-coated graphite mixed powder obtained in Experimental Example 3-1, which is magnified at 100 times, is presented in FIG. 12. A rate (coat ratio (area)) of the silver-coated graphite particles of Experimental Example 3-1 was 43%, which was increased compared to the ratio (coat ratio (area)) of 16% of Example 1. It was found that the graphite powder having a smaller BET specific surface area easily achieved increased coat ratio and was suitable for silver coating.

Experimental Example 3-2

A silver-coated graphite mixed powder of Experimental Example 3-2 was obtained in the same manner as in Experimental Example 3-1 except that the aqueous solution was prepared so as to be an aqueous solution (320 mL) containing silver nitrate (0.111 mol/L) at the time of displacement reaction; the amount of the graphite powder after the sensitizing step to be added was an amount of 9 g in terms of the graphite powder as the raw material; and a mass ratio between the silver and the graphite powder as the raw material in the aqueous silver nitrate solution was 3:7.

The silver-coated graphite mixed powder obtained was picked up in an amount of 0.5 g and was immersed in nitric acid. Then, the resultant mixture was filtrated to obtain a solution in which substances other than the graphite powder were dissolved. When the solution was used for measurement of quantitative analysis through ICP in the same manner as in Example 1, the amount of silver was 29% by mass, the amount of zinc was 0.2% by mass, and the amount of tin was 0.054% by mass, in the silver-coated graphite mixed powder.

Figure 13:
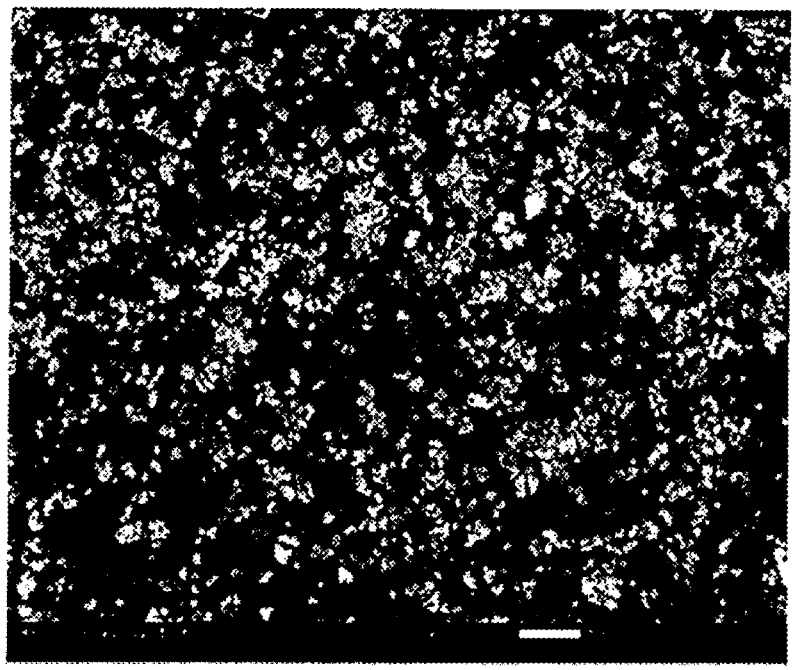
FIG. 13 is a backscattered electron image (×100) of a silver-coated graphite mixed powder of Experimental Example 3-2.

A BEC image of the silver-coated graphite mixed powder obtained in Experimental Example 3-2, which is magnified at 100 times, is presented in FIG. 13. A rate (coat ratio (area)) of the silver-coated graphite particles of Experimental Example 3-2 was 16%. Because the rate of silver was decreased, the ratio (coat ratio (area)) of Experimental Example 3-2 was lower compared to the ratio (coat ratio (area)) of Experimental Example 3-1 where the mass ratio between the silver and the graphite powder as the raw material in the aqueous silver nitrate solution was 1:1. However, the ratio (coat ratio (area)) of Experimental Example 3-2 was equivalent to the ratio (coat ratio (area)) of Example 1 where the mass ratio between the silver and the graphite powder as the raw material in the aqueous silver nitrate solution was 1:1. Therefore, it was found that, even when the rate of silver was decreased, the graphite powder having a smaller BET specific surface area easily achieved increased coat ratio and was suitable for silver coating.

Example 4

—Preparation of Conductive Paste—

The silver-coated graphite mixed powder of Experimental Example 1 (5.52 parts by mass), a flaky silver powder (manufactured by DOWA Electronics Materials Co., Ltd.) (51.888 parts by mass), a spherical silver powder (manufactured by DOWA Electronics Materials Co., Ltd.) (34.592 parts by mass), an epoxy resin (EP4901E, manufactured by ADEKA Corporation) (8 parts by mass), a curing agent ($BF_3NH_2EtOH$, manufactured by Wako Pure Chemical Industries, Ltd.) (0.4 parts by mass), oleic acid (manufactured by Wako Pure Chemical Industries, Ltd.) (0.1 parts by mass), and butyl carbitol acetate (manufactured by Wako Pure Chemical Industries, Ltd.) (2 parts by mass) as a solvent were added and were mixed with a propeller-free rotation and revolution stirring and defoaming apparatus (AR-250, manufactured by THINKY CORPORATION). The resultant was passed through a triple roll mill (EXAKT80S, manufactured by EXAKT) with the roll gaps being gradually narrowed, to obtain a conductive paste of Example 4.

Here, properties of the flaky silver powder and the spherical silver powder used were presented in Table 2. Also, properties of the silver-coated graphite mixed powder used were presented in Table 3.

Experimental Example 5

—Preparation of Conductive Paste—

Figure 14:
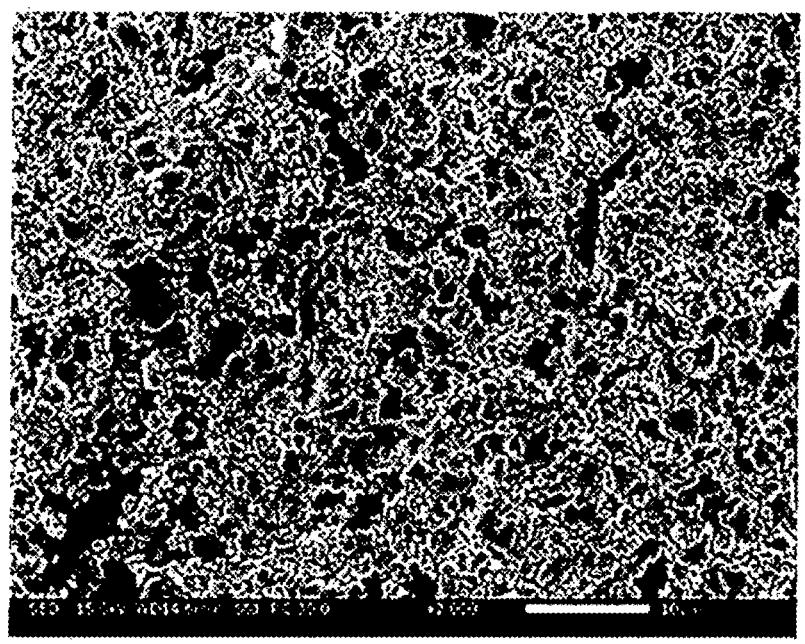
FIG. 14 is a scanning electron microscopic image (×2,000) of a conductive film prepared by using a conductive paste of Experimental Example 5.

A conductive paste of Experimental Example 5 was prepared in the same manner as in Experimental Example 4 except that the silver-coated graphite mixed powder of Experimental Example 1 was changed to the silver-coated graphite mixed powder of Experimental Example 3. A scanning electron microscopic image (×2,000) of a conductive film produced by using the conductive paste of Experimental Example 5 was presented in FIG. 14.

Comparative Example 4

—Preparation of Conductive Paste—

Figure 15:
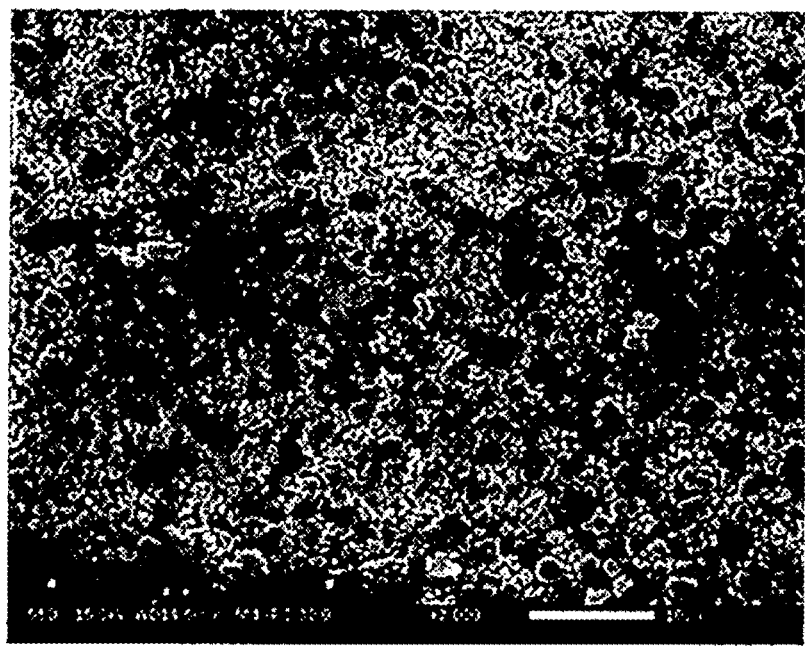
FIG. 15 is a scanning electron microscopic image (×2,000) of a conductive film prepared by using a conductive paste of Comparative Example 4.

A conductive paste of Comparative Example 4 was prepared in the same manner as in Experimental Example 4 except that the silver-coated graphite mixed powder of Experimental Example 1 was not added and the total amount of silver in the conductive paste was changed to an amount of each component presented in Table 4 in order to correspond to Example 4 or Example 5. A scanning electron microscopic image (×2,000) of a conductive film prepared by using the conductive paste of Comparative Example 4 was presented in FIG. 15.

Comparative Example 5

—Preparation of Conductive Paste—

A conductive paste of Comparative Example 5 was prepared in the same manner as in Experimental Example 4 except that the silver-coated graphite mixed powder of Experimental Example 1 was changed to a graphite powder and the amount of each component presented in Table 4 was employed. Here, properties of the graphite powder used were presented in Table 3.

Comparative Example 6

—Preparation of Conductive Paste—

Figure 16:
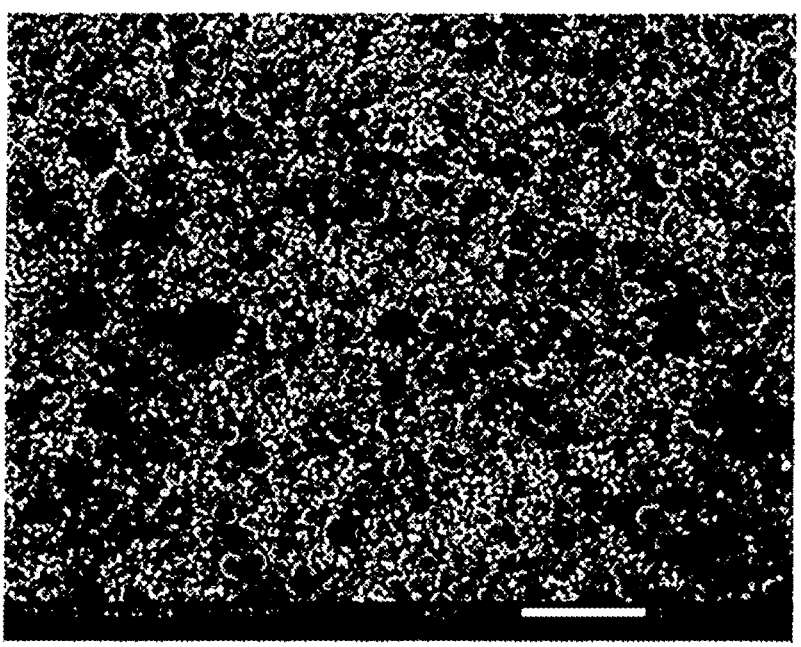
FIG. 16 is a scanning electron microscopic image (×2,000) of a conductive film prepared by using a conductive paste of Comparative Example 6.

A conductive paste of Comparative Example 6 was prepared in the same manner as in Experimental Example 4 except that the silver-coated graphite mixed powder of Experimental Example 1 was changed to the flake graphite powder and the amount of each component presented in Table 4 was employed. Here, properties of the flake graphite powder used were presented in Table 3. A scanning electron microscopic image (×2,000) of a conductive film prepared by using the conductive paste of Comparative Example 6 was presented in FIG. 16.

TABLE 2

| | Silver powder | | | | | |
| --- | --- | --- | --- | --- | --- | --- |
| | BET specific surface area | Tap density | Ignition loss | Particle size distribution (μm) | | |
| Kind | $(m^2/g)$ | (g/mL) | (%) | $D_{10}$ | $D_{50}$ | $D_{90}$ |
| Flaky silver powder | 0.95 | 5.1 | 0.91 | 1 | 2.2 | 4 |
| Spherical silver powder | 0.98 | 4.3 | 0.41 | 0.5 | 1.1 | 2.2 |

TABLE 3

| | Details | | BET specific surface area | Particle size distribution (μm) | | | Specific resistance 1 |
| --- | --- | --- | --- | --- | --- | --- | --- |
| | Powder used | (carbon powder) | $(m^2/g)$ | $D_{10}$ | $D_{50}$ | $D_{90}$ | $(\Omega \cdot cm)$ |
| Comparative Example 5 | Graphite powder (without coat) | Graphite powder | 13.3 | 3.2 | 8.3 | 17.5 | $5.7 \times 10^{-3}$ |
| Comparative Example 6 | | Flake graphite (BF-15AK) | 5.4 | 5.8 | 15.7 | 31.6 | $3.3 \times 10^{-3}$ |
| Experimental Example 4 | Silver-coated graphite mixed powder | Graphite powder | 8.5 | 2.3 | 7.7 | 16.6 | $6.2 \times 10^{-4}$ |
| Experimental Example 5 | | Flake graphite (BF-15AK) | 5.7 | 3.4 | 13.4 | 28.4 | $5.5 \times 10^{-4}$ |

TABLE 4

| | Experimental Example 4 | Experimental Example 5 | Comparative Example 4 | Comparative Example 5 | Comparative Example 6 |
| --- | --- | --- | --- | --- | --- |
| Flaky silver powder | 51.888 | 51.888 | 53.544 | 53.544 | 53.544 |
| Spherical silver powder | 34.592 | 34.592 | 35.696 | 35.696 | 35.696 |
| Epoxy resin | 8 | 8 | 8 | 8 | 8 |
| Curing agent | 0.4 | 0.4 | 0.4 | 0.4 | 0.4 |
| Oleic acid | 0.1 | 0.1 | 0.1 | 0.1 | 0.1 |
| Solvent | 2 | 2 | 2 | 2 | 2 |

TABLE 4-continued

| | | Experimental Example 4 | Experimental Example 5 | Comparative Example 4 | Comparative Example 5 | Comparative Example 6 |
|---|---|---|---|---|---|---|
| Graphite powder (without coat) | Graphite powder | — | — | — | 2.76 | — |
| | Flake graphite powder (BF-15AK) | — | — | — | — | 2.76 |
| Silver-coated graphite mixed powder | Graphite powder | 5.52 | — | — | — | — |
| | Flake graphite powder (BF-15AK) | — | 5.52 | — | — | — |

The conductive paste obtained was measured for viscosity, thermal conductivity, and specific resistance 3 as described below and was evaluated for properties in the same manner as described above. Results were presented in Table 5 and Table 6.

<Viscosity of Conductive Paste>

The viscosity of each conductive paste was measured at 25° C. (paste temperature) using a viscometer 5XHBDV-IIIUC (manufactured by BROOKFIELD) with a cone spindle CP-52. A value of the viscosity was measured at 1 rpm (shear rate 2 sec$^{-1}$) for 5 minutes.

<Thermal Conductivity>

Each conductive paste was cured at 200° C. for 20 minutes to prepare a molded product sample having a diameter of 10 mm and a thickness of 1 mm.

The sample obtained was measured for the thermal diffusivity through the laser flash method (TC-7000, manufactured by ULVAC, Inc.). From the specific heat and the density, thermal conductivity was determined.

<Specific Resistance 3>

Each conductive paste was coated so as to have a plate-like shape and was cured at 200° C. for 20 minutes to form a body having the plate-like shape. Then, the body was stamped out with a mold to produce a molded product sample having a diameter of 10 mm and a thickness of 1 mm.

The sample obtained was measured for specific resistance 3 through the four-point probe method (Loresta HP MCP-T410, manufactured by Mitsubishi Chemical Corporation).

TABLE 6

| | Details | | Molded product | |
|---|---|---|---|---|
| | | Powder used (carbon powder) | Thermal conductivity (W/m · K) | Specific resistance 3 (μΩ· cm) |
| Comparative Example 4 | None | None | 9.5 | 30 |
| Comparative Example 5 | Graphite powder (without coat) | Graphite powder | 14.3 | 38 |
| Comparative Example 6 | | Flake graphite (BF-15AK) | 17.3 | 21 |
| Experimental Example 4 | Silver-coated graphite mixed powder | Graphite powder | 16.2 | 17 |
| Experimental Example 5 | | Flake graphite (BF-15AK) | 16.4 | 17 |

From the results in Table 5 and Table 6, when the graphite powders were simply mixed as presented in Comparative Examples 5 and 6, their viscosities at 1 rpm were more than 900 Pa·s, which made it difficult to draw a wiring through screen printing.

As presented in Experimental Examples 4 and 5, when each of the silver-coated graphite mixed powders was mixed to prepare a conductive paste, an increase in the viscosity was prevented compared to Comparative Examples 5 and 6, and it is possible to obtain the pastes each having substan-

TABLE 5

| | Details | | Paste | | | |
|---|---|---|---|---|---|---|
| | | Powder used (carbon powder) | Inorganic ratio (% by mass) | Viscosity (1 rpm) (Pa · s) | Viscosity (5 rpm) (Pa · s) | Ratio (1 rpm/5 rpm) |
| Comparative Example 4 | None | None | 89.7 | 558 | 135 | 4.1 |
| Comparative Example 5 | Graphite powder (without coat) | Graphite powder | 89.7 | 905 | 179 | 5.1 |
| Comparative Example 6 | | Flake graphite (BF-15AK) | 89.7 | 933 | 173 | 5.4 |
| Experimental Example 4 | Silver-coated graphite mixed powder | Graphite powder | 89.7 | 757 | 194 | 3.9 |
| Experimental Example 5 | | Flake graphite (BF-15AK) | 89.7 | 813 | 205 | 4.0 | tially the same thixotropic ratio as the thixotropic ratio of the paste of Comparative Example 4 without the graphite powder. Therefore, it was possible to use such pastes without drastically changing the formulation of the paste and the coating method, compared to the paste simply containing the graphite powder. Compared to the cases that the silver-coated graphite mixed powders were not used, it was found that each of the conductive films obtained by coating each conductive paste containing the silver-coated graphite mixed powder had an effect of decreasing specific resistance 3 to increase thermal conductivity and had a compact conductive film in which the amount of the binding between particles was relatively large as seen from the SEM images.

INDUSTRIAL APPLICABILITY

The silver-coated graphite particles and the silver-coated graphite mixed powder of the present invention can be suitably used for a conductive paste for forming electrodes and circuits of various electronic components.

The invention claimed is:

1. A silver-coated graphite mixed powder comprising:
    silver-coated graphite particles each including a graphite particle and silver coated on a surface of the graphite particle,
    wherein when a solution obtained by dissolving the silver-coated graphite mixed powder in nitric acid is analyzed through inductively coupled plasma (ICP) emission spectrometry, an amount of silver is 5% by mass or more but 90% by mass or less, an amount of tin is 0.01% by mass or more but 5% by mass or less, and an amount of zinc is 0.002% by mass or more but 1% by mass or less.

2. The silver-coated graphite mixed powder according to claim 1,
    wherein the amount of silver is 20% by mass or more but 90% by mass or less and the amount of tin is 0.01% by mass or more but 2% by mass or less.

3. The silver-coated graphite mixed powder according to claim 1,
    wherein a coated graphite ratio is 10% or more, wherein the coated graphite ratio is a rate of the silver-coated graphite particles from an area ratio between the silver-coated portion and the graphite portion as determined through binarization processing of a backscattered electron image of the silver-coated graphite mixed powder magnified at 100 times.

4. The silver-coated graphite mixed powder according to claim 1,
    wherein a cumulative 50% point of particle diameter ($D_{50}$) of the silver-coated graphite mixed powder based on volume is 1 μm or more but 20 μm or less.

5. A conductive paste comprising:
    the silver-coated graphite mixed powder according to claim 1;
    a resin; and
    an organic solvent.

6. A method for producing the silver-coated graphite mixed powder according to claim 1, wherein the silver-coated graphite mixed powder includes silver-coated graphite particles each including a graphite particle and silver coated on a surface of the graphite particle, the method comprising:
    subjecting a graphite powder to sensitizing with an aqueous solution of a tin compound; and
    coating silver on a surface of the graphite powder after the sensitizing through displacement using a silver complex solution and a zinc powder,
    wherein a pH of the silver complex solution is 6 or more but 14 or less.

7. The method for producing the silver-coated graphite mixed powder according to claim 6,
    wherein the pH of the silver complex solution is 6 or more but 8 or less.

* * * * *